United States Patent [19]
Martinez et al.

[11] Patent Number: 6,163,196
[45] Date of Patent: *Dec. 19, 2000

[54] MICROPOWER DELAY CIRCUIT

[75] Inventors: Steven A. Martinez; Paul M. Henry, both of Tucson, Ariz.

[73] Assignee: National Semiconductor Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/069,485

[22] Filed: Apr. 28, 1998

[51] Int. Cl.$^7$ ........................................................ H03K 5/13
[52] U.S. Cl. ............................ 327/270; 327/276; 327/281
[58] Field of Search ...................... 327/231, 233, 327/234, 237, 243, 246, 250, 261, 262, 263, 266, 269, 270, 271, 272, 278, 280, 281, 287, 288

[56] References Cited

U.S. PATENT DOCUMENTS

| | | | |
|---|---|---|---|
| 4,438,384 | 3/1984 | Akita et al. | 320/48 |
| 4,546,276 | 10/1985 | Freyman et al. | 327/31 |
| 4,837,466 | 6/1989 | Kanauchi | 327/88 |
| 5,028,823 | 7/1991 | Watanabe | 327/126 |
| 5,296,786 | 3/1994 | Habisohn et al. | 318/280 |
| 5,382,840 | 1/1995 | Massoner | 327/206 |
| 5,514,997 | 5/1996 | Quinn | 327/554 |
| 5,570,067 | 10/1996 | Shacter | 331/111 |
| 5,870,345 | 2/1999 | Stecker | 365/222 |
| 5,886,550 | 3/1999 | Kwon et al. | 327/143 |

OTHER PUBLICATIONS

A. Dabrowski et al., Electronics Letters, *Offset–Compensated Switched–Capacitor Delay Circuit That is Insensitive to Stray Capacitance and to Capacitor Mismatch*, May 11, 1989, vol. 25, No. 10, pp. 623–625.

G. Simon, Periodica Polytechnica, *A Stray–Insensitve Switched–Capacitor Delay Circuit*, 1986, vol. 30, No. 2–3, pp. 87–91.

J. Beeley, New Electronics, *Power–Up Delay Circuit*, Jun. 11, 1985, vol. 18, No. 12, p. 29.

*Primary Examiner*—Tuan T. Lam
*Attorney, Agent, or Firm*—Skjerven Morrill MacPherson LLP; Edward C. Kwok

[57] ABSTRACT

To generate a signal delay, a current source, a reference voltage generator and a comparator are turned on. Once turned on, the current source raises the voltage across an initially discharged capacitor to a minimum required threshold. The comparator then compares the capacitor voltage to the reference voltage thereby to generate the delay signal. Thereafter, the current source, the reference voltage generator and substantial blocks of circuitry in the comparator are switched off to reduce quiescent power consumption.

19 Claims, 2 Drawing Sheets

MICROPOWER DELAY CIRCUIT

BACKGROUND OF THE INVENTION

The present invention relates to an analog signal delay circuit requiring a reduced quiescent power consumption.

In electronic circuits, the need often arises for delaying the generation of a signal. For example, a signal that is used to enable a microprocessor must be delayed, until after the microprocessor has reached a desired level of electrical stability.

One of the most widely used analog techniques to effect a signal delay is to force the signal into a wait state until an initially discharged capacitor is charged to a minimum required voltage. The charging time of the capacitor provides the needed delay. According to this technique, when a level transition on a target signal is detected, a current source charges an initially discharged capacitor and, at the same time, a comparator compares the voltage across the capacitor to a reference voltage. When the voltage across the capacitor exceeds the reference voltage, the comparator switches state and causes a delayed replica of the target signal to be generated. Thus the delay period is the length of time required to raise the capacitor voltage to the reference voltage. Therefore, both the capacitance of the capacitor, the magnitude of the current used to charge the capacitor, as well as the value of the reference voltage directly affect the delay period.

The prior art techniques for generating a signal delay, however, suffer from two major disadvantages. First, the magnitude of the current supplied by the current source must be made relatively large to compensate for any leakage current that is present within the circuit. Moreover, because the capacitor is typically chosen to have a relatively large capacitance (in order to minimize the effects of the various parasitic capacitances), a relatively large current is required to charge the capacitor. Second, the current source remains active at all times, thereby, resulting in a relatively large quiescent power dissipation.

SUMMARY OF THE INVENTION

A signal delay circuit, in accordance with the present invention, receives an input signal and generates an output signal after a known period of time. The signal delay generator includes a current source for charging an external capacitor whose voltage is compared against a reference voltage. When the voltage across the capacitor exceeds the reference voltage by a certain value, the delayed signal is generated and is subsequently latched at an output terminal of the circuit. After the delayed signal is generated, the current source and the circuitry generating the reference voltage are switched off to reduce the quiescent power consumption.

The circuit includes a comparator which has two input terminals for receiving the capacitor voltage and the reference voltage and two input terminals for enabling or disabling various operational blocks of the comparator. A first disable input signal turns off the power to substantial blocks of circuitry in the comparator during the initial power-up phase in order to reduce power consumption. Accordingly, the comparator has a much diminished quiescent power consumption during the power-up phase. A second disable input signal keeps the comparator output signal at a logic low level during the power-up operation, thereby preventing glitches from appearing at the output terminal of the comparator.

Currents are supplied to the capacitor, the comparator and the reference voltage circuitry only for the time period needed to generate the delay. Thereafter the current source and the reference voltage circuitry are switched off and the comparator is forced into a low power mode to save power.

DETAILED DESCRIPTION

Figure 1:
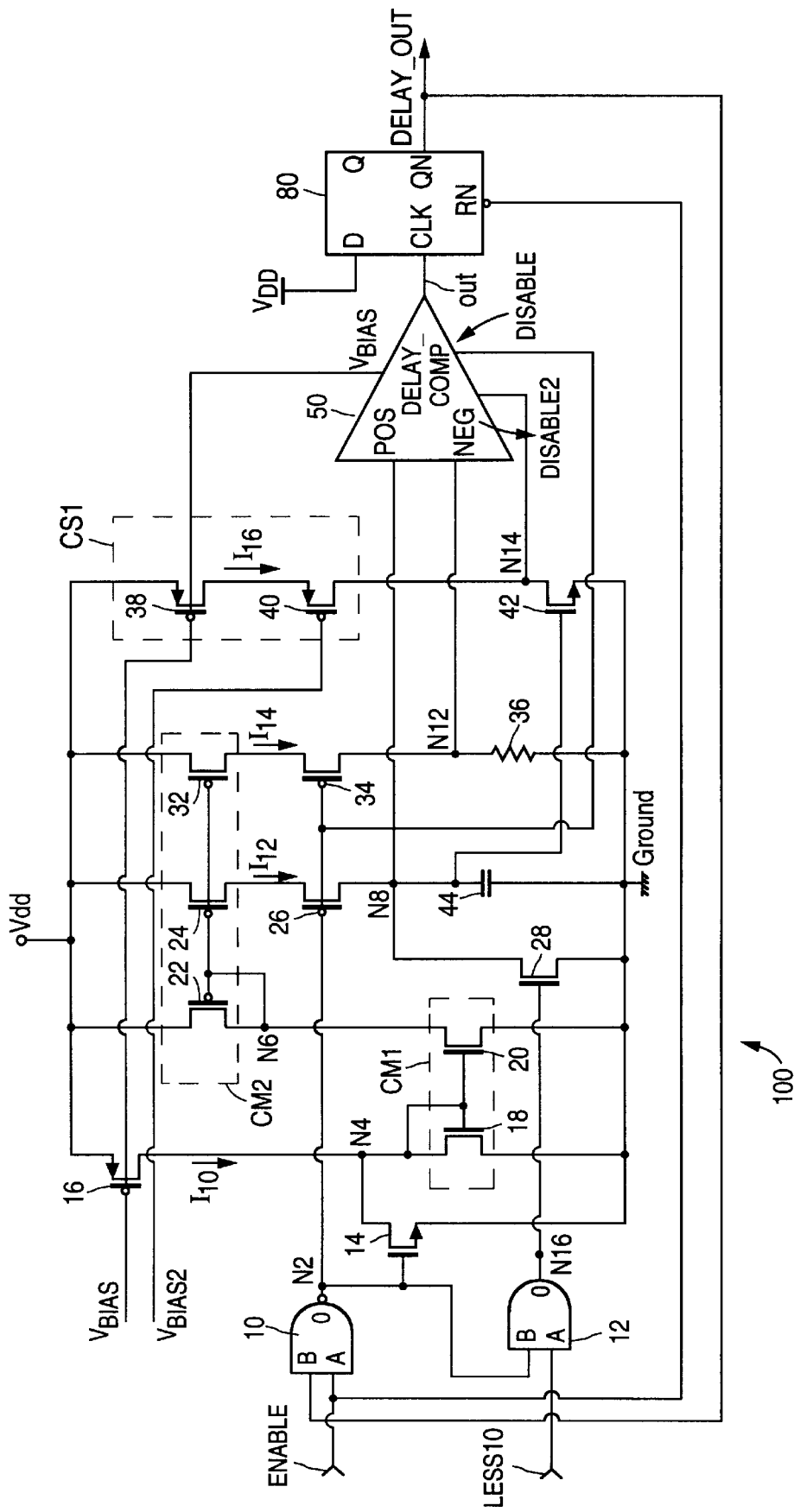
FIG. 1 depicts the mixed transistor and logic level signal delay generator circuit, in accordance with the present invention.

Signal delay circuit 100, shown in FIG. 1, receives signals on input terminals "ENABLE", "LESS10", "VBIAS", "VBIAS2" and generates a signal on output terminal "DELAY_OUT". Specifically, a low level to high level signal transition on input terminal ENABLE forces a high level to low level signal transition on output terminal DELAY_OUT following an elapse of a known time period. Hence, the signal on output terminal DELAY_OUT displays a delayed response to a change in the signal level at the input terminal ENABLE.

For purposes of clarity, circuit 100 is described below for three distinct phases of operation, namely the power-up phase, the delayed-signal generation phase, and the power-down phase. During the power-up phase (i.e. when power is first applied to the circuit) the signal on terminal ENABLE, which is connected to input terminal A of NAND gate 10 and to input terminal RN of flip-flop 80, is at a low level. Consequently, the signal level on terminal DELAY_OUT, which is connected to output terminal QN of flip-flop 80, as well as the signal level on node N2, which is connected to output terminal O of NAND gate 10, are both high.

For purposes of this analysis, the signal on terminal LESS10 is always at a high level and the signals on terminals VBIAS and VBIAS2 are always constant and do not change.

When the signal on terminal ENABLE goes to a low level, the signal on node N2 rises to a high level, thereby, turning on n-channel transistor 14, diverting current I10 away from transistor 18, and pulling node N4 to a low level. When the signal on node N4 is at a low level, current mirror CM1, which includes n-channel transistors 18 and 20, and current mirror CM2, which includes p-channel transistors 22, 24 and 32 are all switched off.

Because the signal on terminal LESS10 is always at a high level, a high level signal on node N2 always forces the signal on node N16, which is connected to the output terminal O of AND gate 12, to go to a high level. A high level signal on node N16, which is connected to the gate terminal of transistor 28, turns on n-channel transistor 28, thereby, forcing the signal on node N8, which is connected to the drain terminal of transistor 28 and to an input terminal of capacitor 44, to a low level, i.e. capacitor 44 is discharged.

Capacitor 44 is an external capacitor, allowing a user to vary the time delay generated by circuit 100. A first terminal of capacitor 44 is connected to a positive terminal POS of comparator circuit 50. A second terminal of capacitor 44 is connected to the system ground. The time delay generated by circuit 100 is largely determined by the capacitance of capacitor 44 and the magnitude of current I12 that charges the capacitor; the larger the capacitance of capacitor 44 and the smaller the magnitude of current I12, the longer the time delay.

With the signal on node N8 at a low level, transistor 42 whose gate terminal is connected to node N8 is turned off, allowing current source CS1, which includes p-channel transistors 38 and 40, to raise the signal on node N14 to a high level, until current source CS1 switches off. Node N14 is connected to the input terminal DISABLE2 of comparator 50. When the signal at input terminal DISABLE2 is at a high level, the signal at output terminal OUT of comparator 50 is at a low level.

Node N2 is also connected to input terminal DISABLE of comparator 50. When the signal at input terminal DISABLE is at a high level, comparator 50 switches off. Therefore, during the power-up phase, (a) a current flows from the power supply Vdd through p-channel transistor 16 and n-channel transistor 14 to ground; (b) the signal at terminal OUT which is connected to clock input terminal CLK of flip-flop 80 is at a low level and (c) the signal at terminal DELAY_OUT is at a high level.

The operation of circuit 100 during the delay generation phase (i.e. after the power-up phase is completed) is discussed next. The signal on terminal ENABLE goes to a high level, forcing the signal on node N2 to go to a low level. A low level signal on node N2 turns off transistor 14 and turns on transistors 26 and 34. With transistor 14 turned off, current mirrors CM1 and CM2 turn on, forcing current I12, which flows through transistors 24 and 26, to charge capacitor 44. At substantially the same time, current I14 flows through transistors 32 and 34, establishing a DC voltage level across resistor 36. A low level signal on node N2 also turns on comparator 50. However, so long as the signal on input terminal DISABLE2 remains at a high level, the signal at output terminal OUT of comparator 50 remains unresponsive to changes in the signal levels of POS and NEG terminals of comparator 50 and, as such, maintains its low level.

Following an elapse of a known time period, the charge deposited by current I12 on capacitor 44 raises the voltage potential of node N8 to a level higher than the threshold voltage of n-channel MOS transistor 42, turning on transistor 42, thereby pulling the signal on terminal DISABLE2 to a low level. With the signal at input terminals DISABLE and DISABLE2 both at low levels, the signal level at terminal OUT is determined solely by the signal levels on input terminals POS and NEG of comparator 50.

When the voltage across capacitor 44 exceeds that across resistor 36 (i.e. the voltage signal on input terminal POS is higher than that on input terminal NEG) the signal on output terminal OUT of delay comparator 50 changes level, going from a low to a high. This transition triggers a rising edge clock signal on input terminal CLK of flip-flop 80, thereby, forcing the signal on output terminal DELAY_OUT of circuit 100 to go from a high level to a low level. Consequently, the signal on output terminal DELAY_OUT responds to changes in the signal level on input terminal ENABLE only after capacitor 44 is charged.

The operation of circuit 100 during the power-down phase is discussed next. Following the high level to low level signal transition on terminal DELAY_OUT, the signal on node N2 which is connected to the output terminal O of NAND gate 10 goes from a low to a high level. When the signal on node N2 goes to a high level, the following events occur: n-channel transistor 14 turns on, causing current I10 to be diverted away from current mirror CM1 and to flow to ground through transistor 14; current mirrors CM1 and CM2 as well as p-channel transistors 26 and 34 switch off; the signal on node N16 goes to a high level forcing n-channel transistor 28 to turn on. When transistor 28 turns on, capacitor 44 is discharged and the voltage at node N8 is pulled to a low level, which in turn causes transistor 42 to be turned off, thereby, turning off cascode current source CS1.

Thereafter, the signals at input terminals DISABLE and DISABLE2 of comparator 50 both reach high levels, thereby disabling comparator 50 while, at the same time, forcing the signal at output terminal OUT to go to a low level. Moreover, because the signal at output terminal DELAY_OUT of flip-flop 80 is latched, the signal level will not change unless circuit 100 is powered up again.

Advantageously circuit 100, after a high to low transition of the signal level on DELAY_OUT terminal, turns off current mirrors CM1, CM2 and current source CS1. Therefore, delay circuit 100 consumes less power than delay circuits of the type known in the prior art.

In some embodiments of the present invention, the sizes of the transistors in delay generator circuit 100 are as shown in following table:

| Transistor No. | channel width($\mu$m) | channel length($\mu$m) |
|---|---|---|
| 14 | 3 | 6 |
| 16 | 8 | 32 |
| 18 | 3 | 24 |
| 20 | 9 | 24 |
| 22 | 4 | 6 |
| 24 | 4 | 6 |
| 26 | 20 | 3 |
| 28 | 300 | 3 |
| 34 | 20 | 3 |
| 38 | 8 | 32 |
| 40 | 8 | 3 |
| 42 | 40 | 8 |

Figure 2:
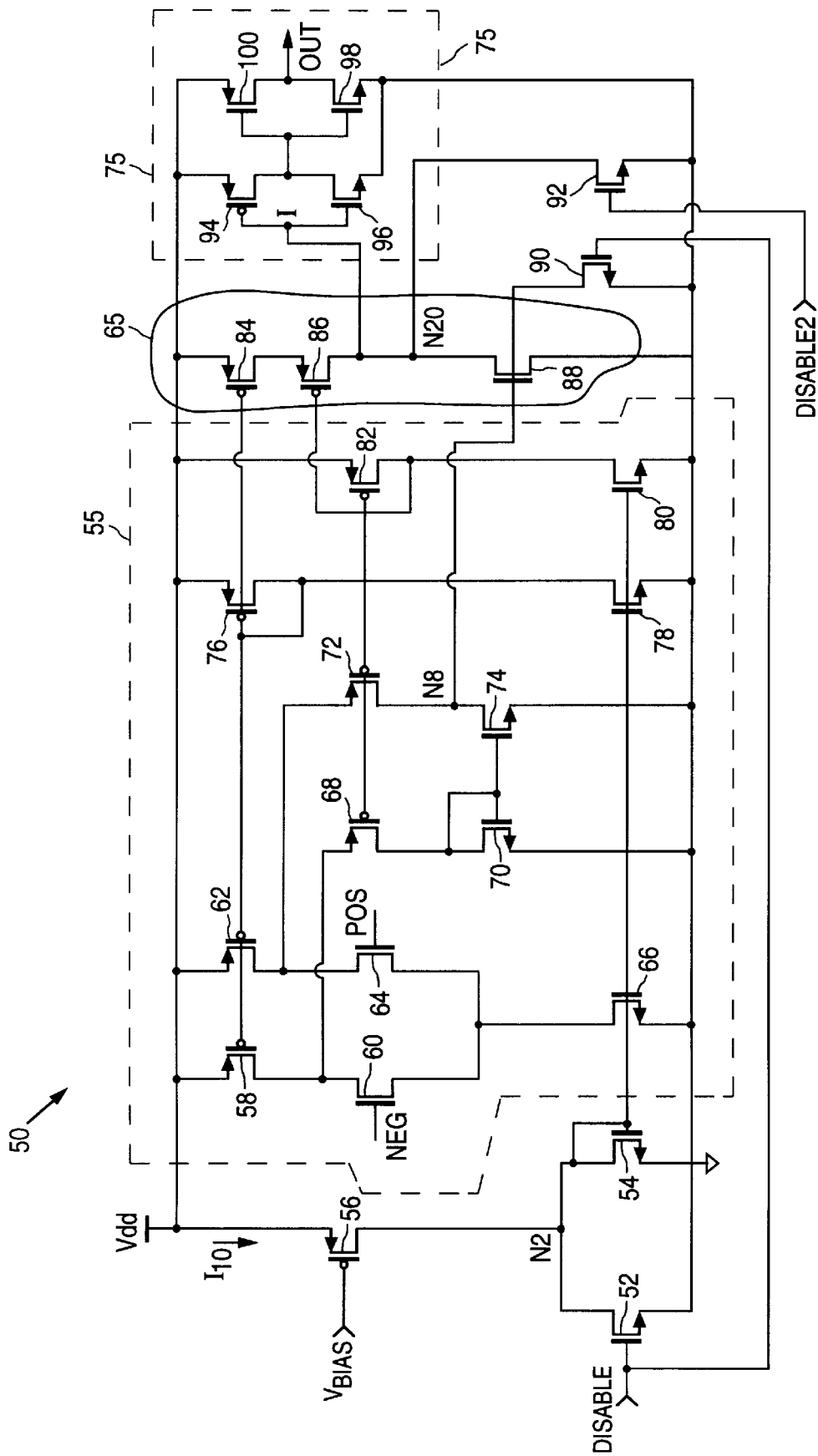
FIG. 2 depicts the transistor schematic representation of the comparator block of FIG. 1.

The operation of comparator 50, shown in FIG. 2, is discussed next. Comparator 50 receives signals on input terminals VBIAS, DISABLE, DISABLE2, POS and NEG and generates a signal, which is representative of the difference between the signal levels on terminals POS and NEG, on output terminal OUT. Comparator 50 includes, in addition to other circuitry, stages 55, 65 and 75, each of which is described below.

A constant bias signal is always applied to input terminal VBIAS, which is connected to the gate terminal of p-channel transistor 56.

Input terminal DISABLE2 enables or disables output stage 75 of comparator 50 depending on whether the signal at terminal DISABLE2 is at a low or a high level, respectively. When the signal at input terminal DISABLE2 is at a high level, n-channel transistor 92 turns on, forcing node N20 to go to a low level which, in turn, effects a low level signal on output terminal OUT. Consequently, a high level signal on terminal DISABLE2 isolates output stage 75 from stages 55 and 65 of comparator 50. When DISABLE2 has a low level signal, transistor 92 turns off and the signal level on output terminal OUT is controlled by the level of signals at the input terminals POS and NEG of comparator 50. Consequently, a low level signal on terminal DISABLE2 enables output stage 75.

Input terminal DISABLE enables or disables comparator 50 depending on whether the signal at terminal DISABLE is at a low level or a high level, respectively. When the signal on input terminal DISABLE is at a high level, transistor 52 turns on, and because the aspect ratio (the ratio of the channel-width to the channel-length) of transistor 52 is greater than that of transistor 54, most of current I10 flowing through transistor 56 is diverted away from transistor 54 and flows to the system ground through transistor 52. Eventually, when the voltage potential at node N2 falls below a certain threshold, transistor 54 turns off, and, consequently, transistors 66, 78 and 80 which are mirrored to produce currents similar to that flowing through transistor 54, also turn off. When transistor 78 turns off, current sources which include p-channel transistors 58, 62 and 84 also turn off. A high level signal on input terminal DISABLE also turns on n-channel transistor 90, pulling the signal on node N8 to a low level and thereby turning off n-channel transistor 88. Therefore, when the signal at terminal DISABLE is at a high level, folded-cascode amplifier 55 (discussed below) and common-source amplifier 65 (discussed below) are both disabled.

During the power-up phase, high level signals are present on both input terminals DISABLE and the DISABLE2. Therefore, during the power-up phase, comparator 50 is disabled and the signal at the output terminal OUT of comparator 50 is maintained at a low level.

During the signal delay generation phase, Both signals DISABLE and DISABLE2 are pulled to low levels. However, in order to ensure that unreliable data does not appear on output terminal OUT, (due to a finite settling time of the comparator 50) it is required that the signal on input terminal DISABLE reaches a low level—thereby enabling comparator 50 to compare the signal levels on terminals POS and NEG—before the signal on input terminal DISABLE2 reaches a low level. As discussed earlier, because the signal level on terminal DISABLE2 does not go low until after capacitor 44 of circuit 100 is partially charged, while no such restriction is imposed on the generation of the low level signal on terminal DISABLE, circuit 100 meets the requirement that the signal level on terminal DISABLE goes low before the signal level on terminal DISABLE2 goes low. Therefore, the low level signal which was forced on output terminal OUT during the power-up phase remains thereon and does not change until after the signal on terminal DISABLE2 is forced to a low level.

After comparator 50 settles, the signal on input terminal DISABLE2 goes to a low level, coupling output stage 75 to stage 65 of comparator 50 and thereby allowing the data representative of the difference between the relative sizes of the signals at input terminals POS and NEG to appear at output terminal OUT.

The low level signal at terminal DISABLE also turns off transistor 52 and forces current I10, which is generated by transistor 56, to flow through transistor 54. Current I10 is subsequently mirrored by transistors 66, 78 and 80 thereby to enable stages 55 and 65 of comparator 50.

Stage 55, which includes transistors 58, 60, 62, 64, 66, 68, 70, 72, 74, 76, 78, 80 and 82, constitutes what is well known in the art as a folded-cascode differential amplifier (hereinafter amplifier 55). Amplifier 55, receives input signals at terminals POS and NEG and generates at its output node N8 a signal whose magnitude is proportional to the difference between the signal levels at input terminals POS and NEG. The POS terminal of amplifier 55 is connected to node N8 of circuit 100 (shown in FIG. 1) and the NEG terminal of amplifier 55 is connected to node N12 of circuit 100. Amplifier 55 has a high gain and a high output impedance.

Stage 65 is a cascode common-source amplifier stage (hereinafter amplifier 65), and is well known in the art. Amplifier 65 includes p-channel cascode load transistors 84 and 86 and n-channel amplifier transistor 88. Output node N8 of amplifier 55 is connected to the input lead—the gate terminal of transistor 88—of amplifier 65. Amplifier 65 generates at its output node N20 a signal whose magnitude is substantially higher than the magnitude of the signal amplifier 65 receives at the gate terminal of transistor 88. Cascode configuration formed by transistors 84 and 86 increases the impedance at output node N20 of amplifier 65.

Stage 75 is formed by a pair of CMOS inverters and is well known in the art. Stage 75 receives, on its input lead I, the signal produced by amplifier 65 at its output node N20, and generates a signal that is disposed on terminal OUT of comparator 50.

As mentioned earlier, during the signal generation phase, the signal level on POS terminal of comparator 50 is higher than that on terminal NEG. Therefore, during the signal generation phase, the signal at terminal OUT of comparator 50 goes from a low to a high level. The low to high signal transition on terminal OUT during the signal generation phase, triggers a rising edge signal on clock input terminal CLK of flip-flop 80 (shown in FIG. 1), forcing the output QN of flip-flop 80 to go from a high to a low level.

During the power-down phase, the signal on terminal DISABLE goes to a high level thereby to disable stages 55 and 65 of comparator 50 in order to save power. The signal on terminal DISABLE2 also goes to a high level, thereby pulling the signal on terminal OUT from a high to a low level.

In some embodiments of the present invention, the sizes of the transistors in comparator 50 are as shown in the following table:

| Transistor No. | channel width($\mu$m) | channel length($\mu$m) |
|---|---|---|
| 52 | 3 | 6 |
| 54 | 8 | 32 |
| 56 | 16 | 32 |
| 58 | 20 | 16 |
| 60 | 150 | 6 |
| 62 | 20 | 16 |
| 64 | 150 | 6 |
| 66 | 16 | 32 |
| 68 | 80 | 3 |
| 70 | 8 | 32 |
| 72 | 80 | 3 |
| 74 | 8 | 32 |
| 76 | 10 | 16 |
| 78 | 8 | 32 |
| 80 | 4 | 32 |
| 82 | 3 | 60 |
| 84 | 10 | 16 |
| 86 | 80 | 3 |
| 88 | 8 | 32 |
| 90 | 3 | 6 |
| 92 | 3 | 6 |
| 94 | 8 | 2 |
| 96 | 4 | 2 |
| 98 | 4 | 2 |
| 100 | 4 | 2 |

The use of n-channel and p-channel MOS transistors in the present invention is solely for the purpose of illustrating an exemplary embodiment of the invention. Other embodiments of this invention will be obvious to those skilled in the art in view of this description and are intended to fall within the scope of the appended claims.

We claim:

1. An Integrated Circuit (IC) for providing an output signal having a time delay, said circuit comprising:
   a capacitor;
   a first current mirror for charging said capacitor; said first current mirror to switch off after a voltage across said capacitor exceeds a reference voltage; wherein said time delay is determined by the capacitance of said capacitor and the magnitude of current supplied by said first current mirror;

an input terminal for receiving an enabling signal for enabling said IC; and a resistor for generating said reference voltage, said resistor for receiving a current that is substantially similar in magnitude to the current supplied by said first current mirror.

2. The IC of claim 1 further comprising a comparator for comparing the voltage across said capacitor to the reference voltage and generating in response thereto a compare signal indicating the larger of said capacitor voltage and said reference voltage.

3. The IC of claim 2 further comprising a flip-flop whose clock input terminal is connected to said compare signal of said comparator and whose data input terminal is connected to a supply voltage.

4. The IC of claim 3 further comprising a second current mirror coupled to said first current mirror, said second current mirror to control the flow of current in said first current mirror.

5. The IC of claim 4 further comprising a first transistor which when turned on causes the second current mirror to switch off.

6. The IC of claim 5 further comprising a second transistor for discharging said capacitor.

7. The IC of claim 6 wherein said first current mirror comprises two p-channel MOS transistors and said second current mirror comprises two n-channel MOS transistors.

8. The IC of claim 7 further comprising a NAND gate for receiving said enabling signal and an output signal of said flip-flop and generating in response thereto an output signal for applying to the gate terminal of said first transistor.

9. The IC of claim 8 further comprising an AND gate for receiving the output signal of the NAND gate and generating in response thereto a signal for applying to the gate terminal of said second transistor.

10. The IC of claim 9 further comprising a circuit for disabling an output stage of said comparator.

11. The IC of claim 10 further comprising a circuit for disabling said comparator.

12. The IC of claim 11 wherein said comparator includes a folded-cascode amplifier stage coupled to a common-emitter amplifier stage.

13. The IC of claim 12 wherein a first terminal of both said resistor and said capacitor are connected to system ground.

14. The IC of claim 13 wherein said folded-cascode amplifier stage includes a first terminal for receiving a voltage signal of a second terminal of said capacitor and a second terminal for receiving a voltage signal of a second terminal of said resistor.

15. The IC of claim 1 wherein the current through said resistor is switched off after the voltage across said capacitor exceeds said reference voltage.

16. The IC of claim 2 wherein said comparator is placed into a low power mode after the voltage across said capacitor exceeds said reference voltage.

17. A method for generating an analog signal delay comprising the steps of:

enabling a current source to charge a previously discharged capacitors;

comparing a voltage across said capacitor to a reference voltage;

storing a signal when the voltage across said capacitor rises above the reference voltage;

disabling the current source after the signal has been stored; and passing current through a resistor to establish the reference voltage; wherein the current through said resistor is substantially similar in magnitude to the current source.

18. The method of claim 17 further comprising terminating the current passing step following the disabling step.

19. The method of claim 17 further comprising terminating the comparing step following the disabling step.

* * * * *